US012217489B2

(12) United States Patent
Ando

(10) Patent No.: US 12,217,489 B2
(45) Date of Patent: Feb. 4, 2025

(54) LEARNING DATASET GENERATION DEVICE AND LEARNING DATASET GENERATION METHOD

(71) Applicant: FANUC CORPORATION, Yamanashi (JP)

(72) Inventor: Toshiyuki Ando, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 323 days.

(21) Appl. No.: 17/792,550

(22) PCT Filed: Feb. 17, 2021

(86) PCT No.: PCT/JP2021/005864
§ 371 (c)(1),
(2) Date: Jul. 13, 2022

(87) PCT Pub. No.: WO2021/166939
PCT Pub. Date: Aug. 26, 2021

(65) Prior Publication Data
US 2023/0005250 A1 Jan. 5, 2023

(30) Foreign Application Priority Data
Feb. 19, 2020 (JP) .................................. 2020-026277

(51) Int. Cl.
*G06V 10/774* (2022.01)
*G06F 30/12* (2020.01)
*G06T 7/70* (2017.01)

(52) U.S. Cl.
CPC .......... *G06V 10/7747* (2022.01); *G06F 30/12* (2020.01); *G06T 7/70* (2017.01)

(58) Field of Classification Search
CPC ....... G06V 10/7747; G06F 30/12; G06T 7/70; B25J 9/163; B25J 9/1697; B25J 9/1656; G05B 2219/40053; G05B 2219/45063
See application file for complete search history.

(56) References Cited

U.S. PATENT DOCUMENTS

2002/0169522 A1 11/2002 Kanno
2011/0010009 A1* 1/2011 Saito ..................... B25J 9/1612
703/13

(Continued)

FOREIGN PATENT DOCUMENTS

EP 1256860 A2 11/2002
JP 2002331480 A 11/2002

(Continued)

OTHER PUBLICATIONS

International Search Report dated Apr. 6, 2021, for International Patent Application No. PCT/JP2021/005864.

(Continued)

*Primary Examiner* — Phuoc Tran
(74) *Attorney, Agent, or Firm* — KARCESKI IP LAW, PLLC

(57) ABSTRACT

A learning dataset generation device includes: a memory that stores three-dimensional CAD data of a workpiece and a container; and one or more processors including hardware, wherein the one or more processors are configured to use the three-dimensional CAD data of the workpiece and the container, stored in the memory, to generate, in a three-dimensional virtual space, a plurality of imaging objects in which a plurality of the workpieces are bulk-loaded in different forms inside the container, acquire a plurality of virtual distance images by measuring each of the generated imaging objects by means of a virtual three-dimensional measurement machine disposed in the three-dimensional virtual space, accept at least one teaching position for each (Continued)

of the acquired virtual distance images, and generate a learning dataset by associating the accepted teaching position with each of the virtual distance images.

2 Claims, 4 Drawing Sheets

(56) References Cited

U.S. PATENT DOCUMENTS

| | | |
|---|---|---|
| 2017/0124120 A1 | 5/2017 | Shinzato |
| 2018/0130376 A1* | 5/2018 | Meess .................. G09B 5/06 |
| 2018/0276501 A1 | 9/2018 | Yamada et al. |
| 2019/0084151 A1 | 3/2019 | Bai et al. |
| 2019/0091869 A1 | 3/2019 | Yamazaki et al. |
| 2020/0410754 A1 | 12/2020 | Sugano et al. |
| 2021/0049033 A1 | 2/2021 | Okawa et al. |
| 2022/0317647 A1* | 10/2022 | Shimakawa ..... G05B 19/41885 |

FOREIGN PATENT DOCUMENTS

| | | |
|---|---|---|
| JP | 2018161692 A | 10/2018 |
| JP | 2019058960 A | 4/2019 |
| JP | 2019153246 A | 9/2019 |
| JP | 2019153863 A | 9/2019 |
| WO | 2015140922 A1 | 9/2015 |
| WO | 2019055848 A1 | 3/2019 |
| WO | 2019167300 A1 | 9/2019 |
| WO | 2019172101 A1 | 9/2019 |

OTHER PUBLICATIONS

Z. Yang, et al., "Construction of Virtual Datasets for Bin Picking", 2019 International Conference on Computer Science, Communications and Big Data (CSCBD 2019), pp. 47-53 (Mar. 24, 2019).

* cited by examiner

LEARNING DATASET GENERATION DEVICE AND LEARNING DATASET GENERATION METHOD

CROSS-REFERENCE TO RELATED APPLICATION(S)

This is a National Stage Entry into the United States Patent and Trademark Office from International Patent Application No. PCT/JP2021/005864, filed on Feb. 17, 2021, which claims priority to Japanese Patent Application No. 2020-026277, filed on Feb. 19, 2020, the entire contents of both of which are incorporated herein by reference.

FIELD OF THE INVENTION

The present disclosure relates to a learning dataset generation device and a learning dataset generation method.

BACKGROUND OF THE INVENTION

There is a known method of generating a dataset to be used in machine learning by acquiring distance images of a plurality of workpieces by means of a three-dimensional measurement machine, and by storing teaching data comprising the acquired distance images in association with a label map indicating a teaching position (for example, see Japanese Unexamined Patent Application, Publication No. 2019-58960).

The method in Japanese Unexamined Patent Application, Publication No. 2019-58960 is used, for example, for generating a learned model that estimates a take-out position when a plurality of workpieces bulk-loaded in a container are taken out one by one with a hand attached to a robot. In order to generate a highly precise learned model, it is necessary to prepare a huge number of datasets. In other words, every time a dataset is generated, it is necessary to bulk-load the plurality of workpieces in a different form and acquire distance images by means of the three-dimensional measurement machine.

SUMMARY OF THE INVENTION

An aspect of the present disclosure is a learning dataset generation device including: a memory that stores three-dimensional CAD data of a workpiece and a container; and one or more processors including hardware, wherein the one or more processors are configured to use the three-dimensional CAD data of the workpiece and the container, stored in the memory, to generate, in a three-dimensional virtual space, a plurality of imaging objects in which a plurality of the workpieces are bulk-loaded in different forms inside the container, acquire a plurality of virtual distance images by measuring each of the generated imaging objects by means of a virtual three-dimensional measurement machine disposed in the three-dimensional virtual space, accept at least one teaching position for each of the acquired virtual distance images, and generate a learning dataset by associating the accepted teaching position with each of the virtual distance images.

DESCRIPTION OF EMBODIMENT(S) OF THE INVENTION

A learning dataset generation device 1 and a learning dataset generation method according to an embodiment of the present disclosure will be described below with reference to the drawings.

Figure 1:
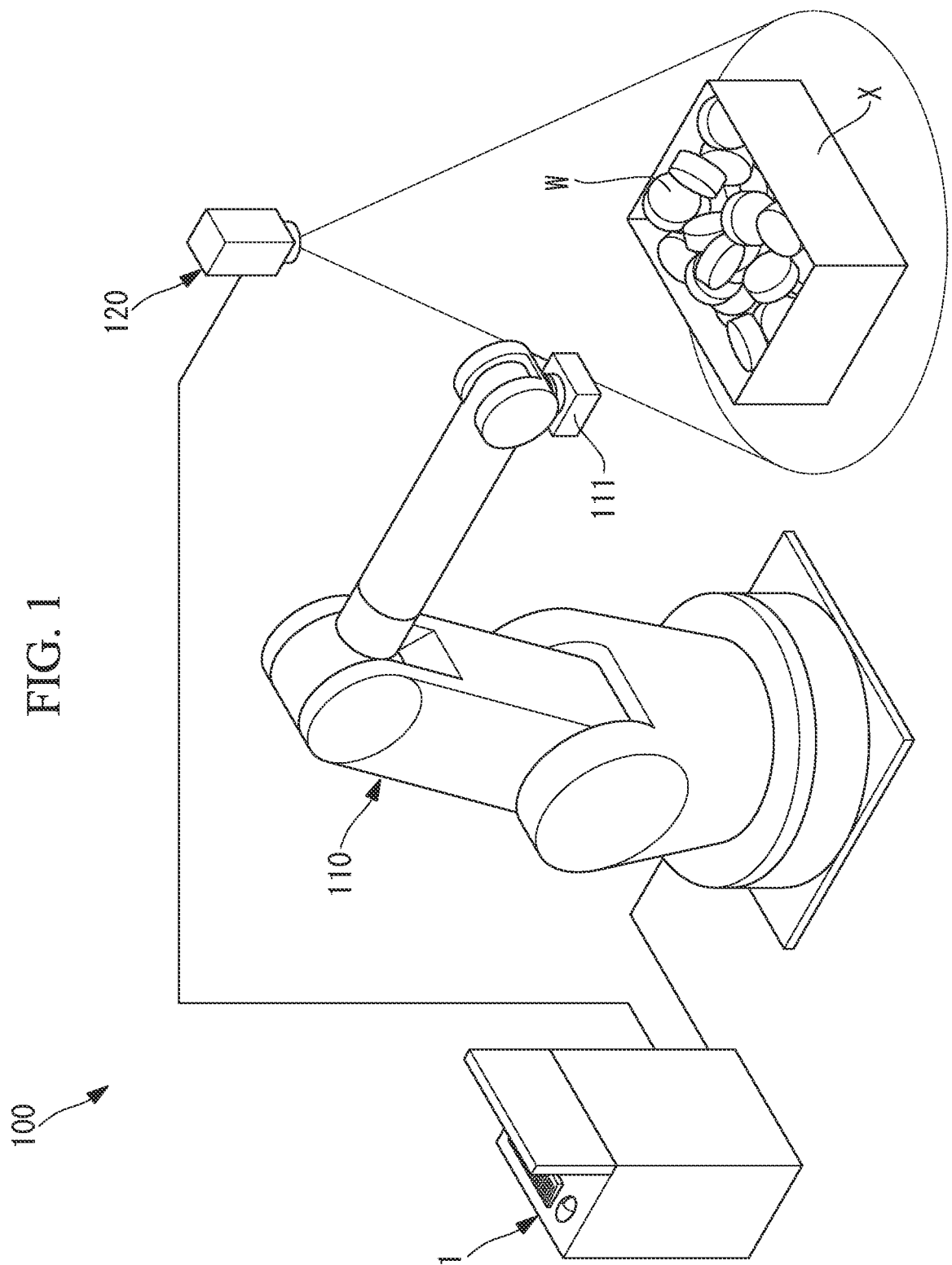
FIG. 1 is an overall configuration diagram showing a robot system employing a learning dataset generation device and a learning dataset generation method according to an embodiment of the present disclosure.

As shown in FIG. 1, the learning dataset generation device 1 according to this embodiment is applied to a robot system 100 including: a robot 110 having a hand 111 at the distal end thereof; and a three-dimensional measurement machine 120 that is precisely positioned with respect to the robot 110 and that has a measurement range vertically therebelow.

This robot system 100 uses a learned model that estimates a take-out position for the robot 110 to take out workpieces W one by one from a container X, which is disposed within the measurement range of the three-dimensional measurement machine 120 and in which a large number of workpieces W are accommodated in a bulk-loaded state.

The learning dataset generation device 1 according to this embodiment is a device that generates a huge number of learning datasets to be used for generating the learned model.

Figure 2:
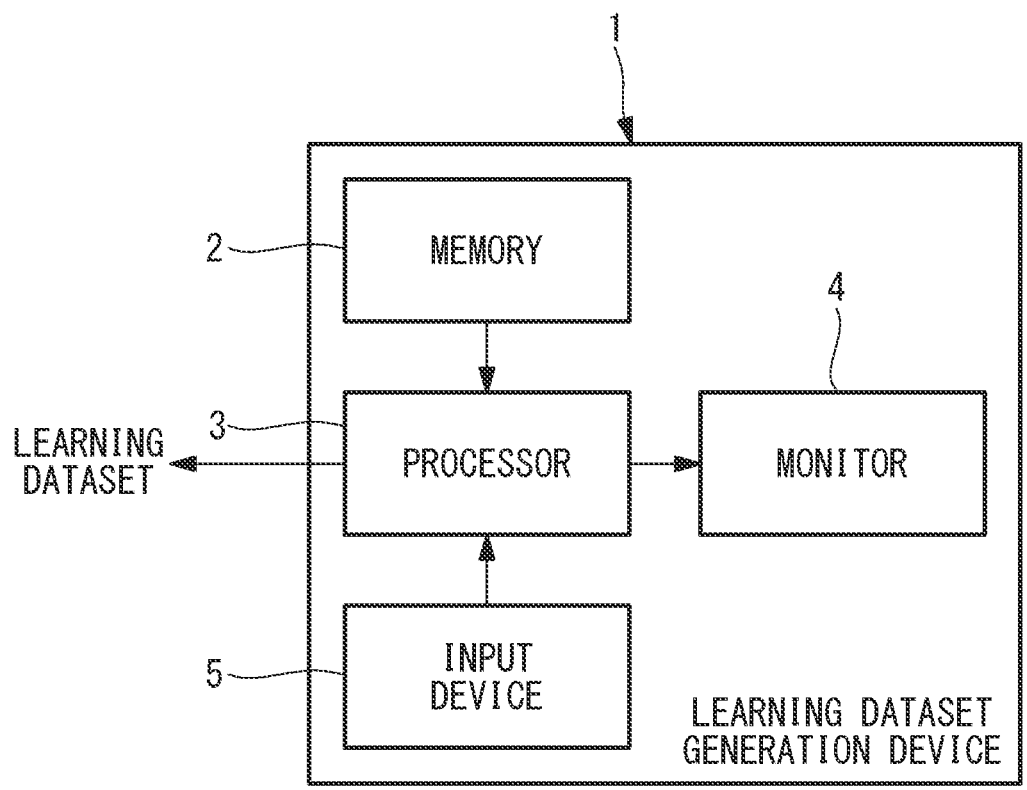
FIG. 2 is a block diagram showing the learning dataset generation device in FIG. 1.

As shown in FIG. 2, the learning dataset generation device 1 is a computer including a memory 2, a processor 3, a monitor 4, and a keyboard and a mouse serving as an input device 5. The memory 2 stores three-dimensional CAD data of the workpieces W to be actually handled and three-dimensional CAD data of the container X to be actually used.

The processor 3 generates a plurality of virtual imaging objects in which the plurality of workpieces W consisting of the three-dimensional CAD data are bulk-loaded in different forms inside the container X consisting of the three-dimensional CAD data stored in the memory 2. By randomly changing the positions and orientations of the workpieces W consisting of the three-dimensional CAD data, it is possible to easily generate, in a short period of time, a plurality of virtual imaging objects in which the workpieces W are bulk-loaded in different forms.

The processor 3 places each of the generated imaging objects consisting of the three-dimensional CAD data in a three-dimensional virtual space and acquires, by employing a publicly known method, distance images of the respective imaging objects by means of a virtual three-dimensional measurement machine installed in the same three-dimensional virtual space.

Every time a distance image is acquired, the processor 3 displays the acquired distance image on the monitor 4 and allows a user to select a workpiece W that can be taken out by the robot 110.

In other words, the user who has visually confirmed the distance image displayed on the monitor 4 designates a workpiece W that can be taken out, by means of the mouse or the keyboard serving as the input device 5. By doing so, the processor 3 accepts the positions (for example, the center-of-gravity positions) of one or more workpieces W designated by the user as one or more teaching positions for the robot 110 to take out those workpieces W.

Then, the processor 3 associates the accepted teaching positions with the previously acquired distance image, thereby generating a learning dataset, and stores the learning dataset in the memory 2. By repeating the same processing for each of the imaging objects, it is possible to easily generate a huge number of learning datasets in a short period of time.

The learning dataset generation method using the thus-configured learning dataset generation device 1 according to this embodiment will be described below.

First, a three-dimensional model of a virtual robot and a virtual three-dimensional measurement machine are installed in a three-dimensional virtual space defined by the processor 3 such that the positional relationship therebetween matches the positional relationship between the robot 110 and the three-dimensional measurement machine 120 installed in the three-dimensional real space.

In addition, three-dimensional CAD data of workpieces W to be actually handled and three-dimensional CAD data of a container X for accommodating the workpieces W in a bulk-loaded state are stored in advance in the memory 2.

Figure 3:
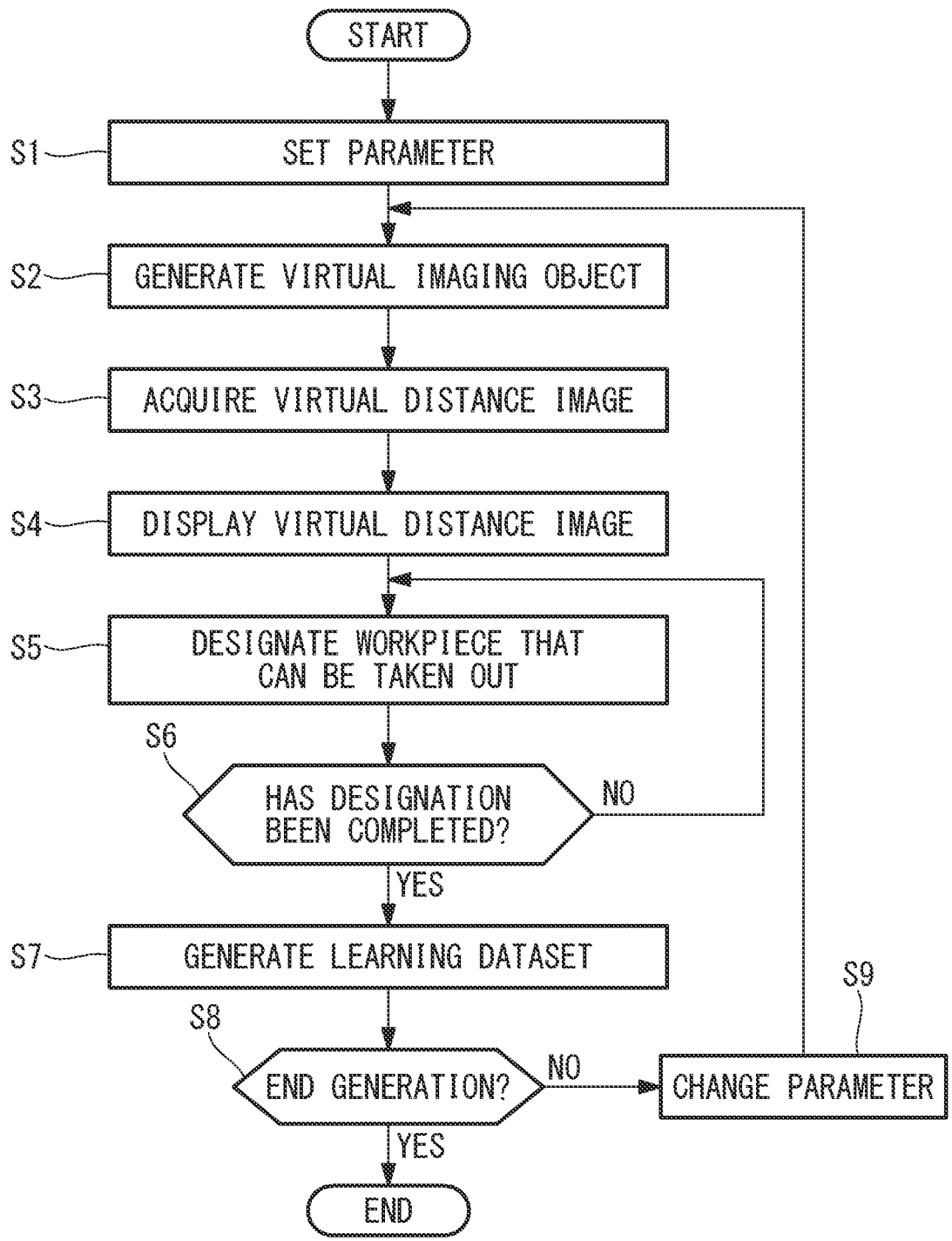
FIG. 3 is a flowchart for explaining the learning dataset generation method using the learning dataset generation device in FIG. 2.

Next, as shown in FIG. 3, bulk-load parameters are set (step S1). The parameters are, for example, the number of workpieces W to be accommodated in the container X and the positions and orientations of a plurality of workpieces W to be arranged on a bottom surface of the container X.

Then, the plurality of workpieces W consisting of the three-dimensional CAD data are accommodated, in a bulk-loaded state, in the container X consisting of the three-dimensional CAD data by using the set parameters. By doing so, a virtual imaging object that consists of the three-dimensional CAD data in which the plurality of workpieces W are accommodated in a bulk-loaded state inside the container X (virtual imaging object) is generated (step S2).

The generated virtual imaging object consisting of the three-dimensional CAD data is measured by means of the virtual three-dimensional measurement machine set in the three-dimensional virtual space, and a distance image of the virtual imaging object (virtual distance image) is acquired (step S3).

Then, the acquired distance image is displayed on the monitor 4 (step S4), and with respect to the displayed distance image, a user is prompted to designate a workpiece W that can be taken out (step S5). By doing so, the center-of-gravity position of the designated workpiece W is accepted as a teaching position.

It is determined whether or not the designation of workpieces W that can be taken out has been completed (step S6), and in the case in which the designation has not been completed, the designation of a workpiece W in step S5 is repeated. In the case in which the designation has been completed, one or more accepted teaching positions are associated with the distance image, whereby a learning dataset is generated (step S7). In the case in which a learning dataset has been generated for one imaging object, the user is prompted to input whether or not to end the generation (step S8), and in the case in which the generation is not ended, the parameters are changed (step S9) and the process from step S2 is repeated.

With this configuration, there is an advantage in that it is possible to easily generate, in a short period of time, learning datasets for a large number of imaging objects in which the plurality of workpieces W are accommodated in the container X in a state in which the workpieces W are bulk-loaded in different forms. In other words, the user does not need to handle actual heavy workpieces W to bulk-load the workpieces W in a different form every time a learning dataset is generated, and thus, it is possible to reduce the burden on the user and also to reduce the time required for generating learning datasets.

In addition, as a result of performing machine learning by using the large number of generated learning datasets, it is possible to generate a highly precise learned model.

In the case in which a workpiece W is taken out from inside the container X by means of the robot 110, the three-dimensional measurement machine 120 disposed in the three-dimensional real space acquires a distance image of the container X, which is disposed in the measurement range of the three-dimensional measurement machine 120 and in which actual workpieces W are accommodated in a bulk-loaded state. Then, as a result of inputting the acquired distance image to a learned model, it is possible to estimate a take-out position of at least one workpiece W that can be taken out by the robot 110.

Note that this embodiment has been described, assuming that the positional relationship between the virtual three-dimensional measurement machine and the container X that are disposed in the three-dimensional virtual space precisely matches the positional relationship between the three-dimensional measurement machine 120 and the container X that are disposed in the three-dimensional real space. However, it is difficult to precisely position the container X with respect to the three-dimensional measurement machine 120 in the three-dimensional real space.

Figure 4:
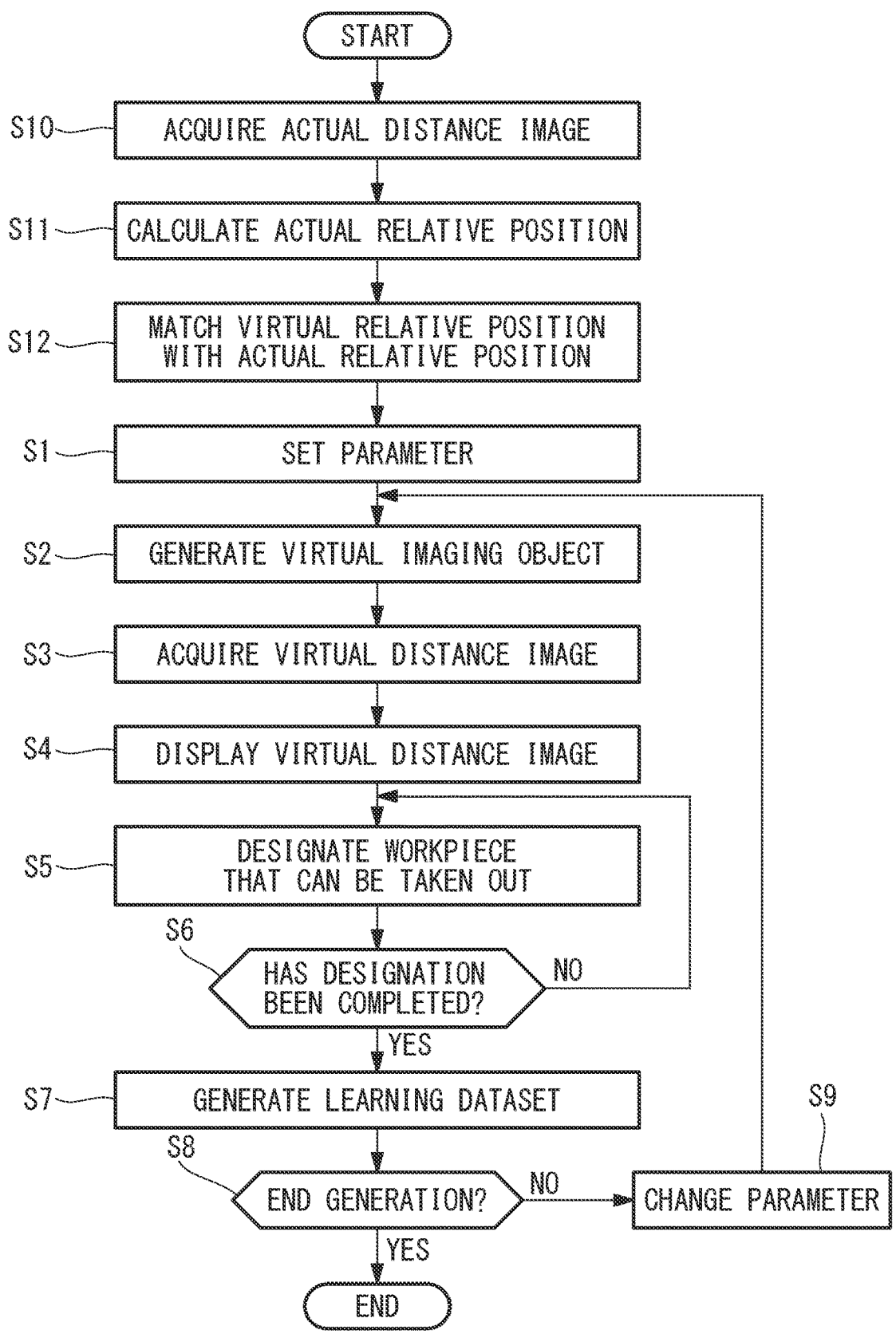
FIG. 4 is a flowchart for explaining a modification of the learning dataset generation method in FIG. 3.

Accordingly, as shown in FIG. 4, the three-dimensional measurement machine 120 is fixed in the three-dimensional real space prior to generation of a learning dataset, and the container X is disposed within the measurement range of the three-dimensional measurement machine 120 to acquire an actual distance image of the container X (actual distance image) (step S10). The relative position between the three-dimensional measurement machine 120 and the container X (actual relative position) is calculated from the acquired actual distance image of the container X (step S11).

Then, at least one of the virtual three-dimensional measurement machine and the container X is moved in the three-dimensional virtual space. By doing so, the relative position between the virtual three-dimensional measurement machine and the container X (virtual relative position) is matched with the actual relative position between the three-dimensional measurement machine 120 and the container X in the three-dimensional real space (step S12), and the process proceeds to step S1.

By performing such processing prior to generation of a learning dataset, it is possible to approximate the virtual distance image, which is displayed on the monitor 4 to allow the user to designate a workpiece W that can be taken out, to the actual distance image acquired by means of the actual three-dimensional measurement machine 120. Therefore, there is an advantage in that it is possible to enhance the precision of a teaching position associated with the virtual distance image and to generate a learning dataset capable of enhancing the precision of a take-out position estimated on the basis of the actual distance image.

The invention claimed is:

1. A learning dataset generation device comprising:
   a memory that stores three-dimensional CAD data of a workpiece and a container; and
   one or more processors comprising hardware,
   wherein the one or more processors are configured to:
   use the three-dimensional CAD data of the workpiece and the container, stored in the memory, to generate, in a three-dimensional virtual space, a plurality of imaging objects in which a plurality of the workpieces are bulk-loaded in different forms inside the container, acquire a plurality of virtual distance images by measuring each of the generated imaging objects by means of a virtual three-dimensional measurement machine disposed in the three-dimensional virtual space, accept at least one teaching position for each of the acquired virtual distance images, generate a learning dataset by associating the accepted teaching position with each of the virtual distance images, and use a distance image of the container in a three-dimensional real space, which is acquired by means of a three-dimensional measurement machine installed in the three-dimensional real space, to set the position of the virtual three-dimensional measurement machine relative to the container in the three-dimensional virtual space to a position matching the arrangement of the three-dimensional measurement machine relative to the container.

2. A learning dataset generation method comprising:

using three-dimensional CAD data of a workpiece and a container to generate, in a three-dimensional virtual space, a plurality of imaging objects in which a plurality of the workpieces are bulk-loaded in different forms inside the container;

acquiring a plurality of virtual distance images by measuring each of the generated imaging objects by means of a virtual three-dimensional measurement machine disposed in the three-dimensional virtual space;

accepting at least one teaching position for each of the acquired virtual distance images;

generating a learning dataset by associating the accepted teaching position with each of the virtual distance images; and using a distance image of the container in a three-dimensional real space, which is acquired by means of a three-dimensional measurement machine installed in the three-dimensional real space, to set the position of the virtual three-dimensional measurement machine relative to the container in the three-dimensional virtual space to a position matching the arrangement of the three-dimensional measurement machine relative to the container.

* * * * *